(12) United States Patent
Hashimoto et al.

(10) Patent No.: US 9,810,532 B2
(45) Date of Patent: Nov. 7, 2017

(54) SUBSTRATE TREATING APPARATUS AND SUBSTRATE TREATING METHODS

(71) Applicant: SCREEN Holdings Co., Ltd., Kyoto (JP)

(72) Inventors: Koji Hashimoto, Kyoto (JP); Akito Hatano, Kyoto (JP); Toyohide Hayashi, Kyoto (JP); Keiichi Tsuchiya, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 62 days.

(21) Appl. No.: 14/855,846

(22) Filed: Sep. 16, 2015

(65) Prior Publication Data

US 2016/0091306 A1 Mar. 31, 2016

(30) Foreign Application Priority Data

Sep. 29, 2014 (JP) ................. 2014-198972

(51) Int. Cl.
| | |
|---|---|
| *G06F 7/00* | (2006.01) |
| *G01B 11/26* | (2006.01) |
| *G01B 11/06* | (2006.01) |
| *G01V 8/20* | (2006.01) |
| *B25J 11/00* | (2006.01) |
| *H01L 21/67* | (2006.01) |
| *H01L 21/677* | (2006.01) |

(52) U.S. Cl.
CPC ......... *G01B 11/26* (2013.01); *B25J 11/0095* (2013.01); *G01B 11/0608* (2013.01); *G01V 8/20* (2013.01); *H01L 21/67259* (2013.01); *H01L 21/67778* (2013.01)

(58) Field of Classification Search
USPC .......................................... 700/218
See application file for complete search history.

(56) References Cited

U.S. PATENT DOCUMENTS 5,906,469 A 5/1999 Oka et al. ............ 414/416
6,267,245 B1 7/2001 Bores et al. ........... 206/711
(Continued)

FOREIGN PATENT DOCUMENTS

| JP | 09-148404 | 6/1997 |
|---|---|---|
| JP | 2002-164411 A | 6/2002 |
| JP | 2004-207260 A | 7/2004 |

(Continued)

*Primary Examiner* — Kyle Logan
(74) *Attorney, Agent, or Firm* — Ostrolenk Faber LLP

(57) ABSTRACT

In a state of mapping sensors having been advanced into a carrier by a sensor advance/withdraw mover, a sensor lifting and lowering device moves the mapping sensors up and down. With this movement, the mapping sensors detect presence or absence of substrates in a horizontal direction crossing a fore-and-aft direction in which the substrates are moved into and out of the carrier, and a height sensor detects heights of the mapping sensors. Consequently, substrate heights are detected in two different locations in the fore-and-aft direction. Based on the substrate heights, a substrate condition acquiring unit acquires a tilt of each substrate relative to the horizontal in the fore-and-aft direction. The tilt of each substrate inside the carrier is acquired in advance, thereby to be able to prevent substrate damage due to contact between a hand of a substrate transport mechanism and the substrates.

14 Claims, 8 Drawing Sheets

(56) References Cited

U.S. PATENT DOCUMENTS

2005/0035313 A1* 2/2005 Garssen ............ H01L 21/67265
250/559.33
2012/0290124 A1 11/2012 Kimura ........................ 700/218

FOREIGN PATENT DOCUMENTS

| JP | 2007-324365 A | 12/2007 |
| JP | 2009-049096 | 3/2009 |
| JP | 2012-235058 | 11/2012 |
| JP | 5185417 | 4/2013 |

* cited by examiner

SUBSTRATE TREATING APPARATUS AND SUBSTRATE TREATING METHODS

CROSS-REFERENCE TO RELATED APPLICATIONS

This application claims priority to Japanese Patent Application No. 2014-198972 filed Sep. 29, 2014 the subject matter of which is incorporated herein by reference in entirety.

TECHNICAL FIELD

This invention relates to substrate treating apparatus and substrate treating methods for treating substrates such as semiconductor substrates, glass substrates for liquid crystal displays, glass substrates for photomasks or substrates for optical disks.

BACKGROUND ART

A substrate treating apparatus includes a support table for receiving a carrier (container) constructed to contain a plurality of substrates (wafers) as arranged at intervals in a vertical direction, a treating section for performing predetermined treatments of the substrates, and a substrate transport mechanism provided between the support table and the treating section. The substrate transport mechanism has a hand for holding the substrates to take the substrates out of the carrier, transport the substrates to the treating section, transport the substrates from the treating section to the carrier, and deposit the substrates in the carrier.

The support table includes one transmission type sensor (mapping sensor) set having a light transmitter and a light receiver. The light transmitter and light receiver are opposed to each other across part of edge regions of the circular substrates, from positions forward of the substrates along substrate surfaces (see Japanese Unexamined Patent Publication No. 2009-049096, for example). This transmission type sensor is vertically movable in the vertical direction of arrangement of the substrates within the carrier to detect the number and positions of the substrates in the carrier, and also to detect whether or not the substrates are arranged on top of one another.

Further, a plurality of transmission type sensor sets are provided in a fore-and-aft direction (depth direction) in which substrates are transported into and out of a carrier, to be able to detect the number and positions of the substrates in the carrier, and also to detect protrusions of the substrates from the carrier (see Japanese Unexamined Patent Publication No. 2009-049096, for example).

Japanese patent No. 5185417 describes a carrier for eliminating a problem of vibration or bouncing of substrates occurring at times of transportation.

Japanese Unexamined Patent Publication H9-148404 describes preventing collision between a substrate transport arm and substrates by detecting vertical "clearances" between the substrates contained in a cassette, and varying operation of the substrate transport arm according to the clearances. Japanese Unexamined Patent Publication No. 2012-235058 describes a safe unloading of substrates from a cassette achieved by calculating "clearances" between the substrates contained in multiple vertical stages in the cassette, and determining from the clearances whether a robot hand can advance into the cassette or not.

SUMMARY OF INVENTION

Technical Problem

The conventional apparatus have the following problem. The substrates are transported out of a carrier by the hand of a substrate transport mechanism. When the substrates are not held in proper positions inside the carrier, the hand may interfere with the substrates inside the carrier to scratch surfaces of the substrates or damage the substrates through contact.

This invention has been made having regard to the state of the art noted above, and its object is to provide substrate treating apparatus and substrate treating methods which can prevent damage to substrates.

Solution to Problem

To fulfill the above object, this invention provides the following construction.

A substrate treating apparatus according to this invention comprises a receiver for receiving a carrier placed thereon, the carrier being constructed to contain a plurality of substrates; a substrate detecting sensor facing a horizontal direction crossing a fore-and-aft direction in which the substrates are moved into and out of the carrier, to detect presence or absence of each substrate; a height sensor for detecting heights of the substrate detecting sensor; an up-and-down mechanism for moving the substrate detecting sensor up and down; an advance/withdraw mechanism for moving the substrate detecting sensor in the fore-and-aft direction; a controller for causing the substrate detecting sensor to detect heights of each substrate in at least two different locations in the fore-and-aft direction by operating the up-and-down mechanism to move the substrate detecting sensor up and down, and operating the advance/withdraw mechanism to move the substrate detecting sensor in the fore-and-aft direction; and a substrate condition acquiring unit for acquiring a tilt of each substrate relative to a horizontal plane in the fore-and-aft direction based on the heights of each substrate detected.

The substrate treating apparatus according to this invention can acquire tilts of the substrates inside the carrier before starting transportation of the substrates from the carrier.

In another aspect of this invention, a substrate treating apparatus comprises a receiver for receiving a carrier placed thereon, the carrier being constructed to contain a plurality of substrates; a substrate detecting sensor for detecting presence or absence of each substrate in at least two different locations in a fore-and-aft direction in which the substrates are moved into and out of the carrier; a height sensor for detecting heights of the substrate detecting sensor; an up-and-down mechanism for moving the substrate detecting sensor up and down; a controller for causing the substrate detecting sensor to detect heights of each substrate in at least two different locations in the fore-and-aft direction by operating the up-and-down mechanism to move the substrate detecting sensor up and down; and a substrate condition acquiring unit for acquiring a tilt of each substrate relative to a horizontal plane in the fore-and-aft direction based on the heights of each substrate detected.

The substrate treating apparatus according to this invention can acquire tilts of the substrates inside the carrier before starting transportation of the substrates from the carrier.

In the above substrate treating apparatus, the substrate condition acquiring unit may be configured to acquire an amount of horizontal substrate displacement toward a deep end of the carrier based on the tilt of each substrate relative to the horizontal plane in the fore-and-aft direction.

In the above substrate treating apparatus, the carrier may include a main container body; a lid attachable to and detachable from the main container body for blocking an opening of the main container body; side holders provided on opposite side surfaces in the main container body for supporting the substrates; rear holders provided on a rear surface in the main container body, and having grooves formed therein; and front holders provided on a surface of the lid facing inside of the main container body, and having grooves formed therein; wherein the rear holders and the front holders are configured to clamp the substrates therebetween while moving the substrates away from the side holders when the lid is attached to the opening of the main container body. When the lid blocking the opening of the main container body is removed, a substrate may not properly slide down from the groove of the rear holder but may stop in a forwardly tilting condition. Even in such a case, the tilt in the fore-and-aft direction of the substrate inside the carrier can be acquired in advance.

The above substrate treating apparatus may further comprise a hand for raising the substrates placed on the side holders and transporting the substrates out of the carrier; wherein a threshold is set for the amount of horizontal substrate displacement toward the deep end of the carrier to prevent backward edges of the substrates from contacting the grooves of the rear holders when the hand raises the substrates.

In the above substrate treating apparatus, the controller may be configured to prohibit the hand from transporting out of the carrier those of the substrates that have the horizontal amount of substrate displacement exceeding the threshold. This construction can reliably prevent the edge, adjacent the deep end of the carrier, of a substrate raised by the hand from contacting the groove of the corresponding rear holder.

The above substrate treating apparatus may further comprise a tilt defect determining unit for determining whether tilts of the substrates are larger than a threshold set beforehand; a storage unit for accumulating tilt defect information on the tilts determined larger by the tilt defect determining unit, for each carrier or for each substrate holding position; a number of times determining unit for determining whether the tilt defect information accumulated in the storage unit has reached a number of times set beforehand; and a reporting unit for reporting that the tilt defect information has reached the number of times when the number of times determining unit determines so. This construction can determine deterioration with age of the carrier, and inform the operator of timing of a carrier change. It is also possible to correct a misteaching at a preceding stage of a substrate transport mechanism of the substrate treating apparatus or to provide a calibration function.

In a further aspect of this invention, a substrate treating method is provided which comprises placing on a receiver a carrier constructed to contain a plurality of substrates; advancing into the carrier a substrate detecting sensor facing a horizontal direction crossing a fore-and-aft direction in which the substrates are moved into and out of the carrier, to be capable of detecting presence or absence of each substrate; causing the substrate detecting sensor to detect heights of each substrate in at least two different locations in the fore-and-aft direction by moving the substrate detecting sensor up and down, and moving the substrate detecting sensor in the fore-and-aft direction in a state where the substrate detecting sensor has been advanced into the carrier; and acquiring a tilt of each substrate relative to a horizontal plane in the fore-and-aft direction based on the heights of each substrate detected.

Another substrate treating method according to this invention comprises placing on a receiver a carrier constructed to contain a plurality of substrates; advancing into the carrier a substrate detecting sensor capable of detecting presence or absence of each substrate in at least two different locations in a fore-and-aft direction in which the substrates are moved into and out of the carrier; causing the substrate detecting sensor to detect heights of each substrate in at least two different locations in the fore-and-aft direction by moving the substrate detecting sensor up and down in a state where the substrate detecting sensor has been advanced into the carrier; and acquiring a tilt of each substrate relative to a horizontal plane in the fore-and-aft direction based on the heights of each substrate detected.

The substrate treating methods according to this invention can acquire tilts of the substrates inside the carrier before starting transportation of the substrates from the carrier.

Advantageous Effects of Invention

With the substrate treating apparatus and substrate treating methods according to this invention, the substrate condition acquiring unit acquires a tilt of each substrate relative to the horizontal in a fore-and-aft direction in which substrates are moved into and out of the carrier, based on substrate heights in the two different locations in the fore-and-aft direction. The tilt of each substrate inside the carrier is acquired in advance, thereby to be able to prevent substrate damage due to contact between a hand of a substrate transport mechanism and the substrates.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIGS. 2A-2C are views showing an example of carrier, in which FIG. 2B is a front view showing part of the carrier seen from sign A in FIG. 2A;

EMBODIMENT 1

Figure 1A:
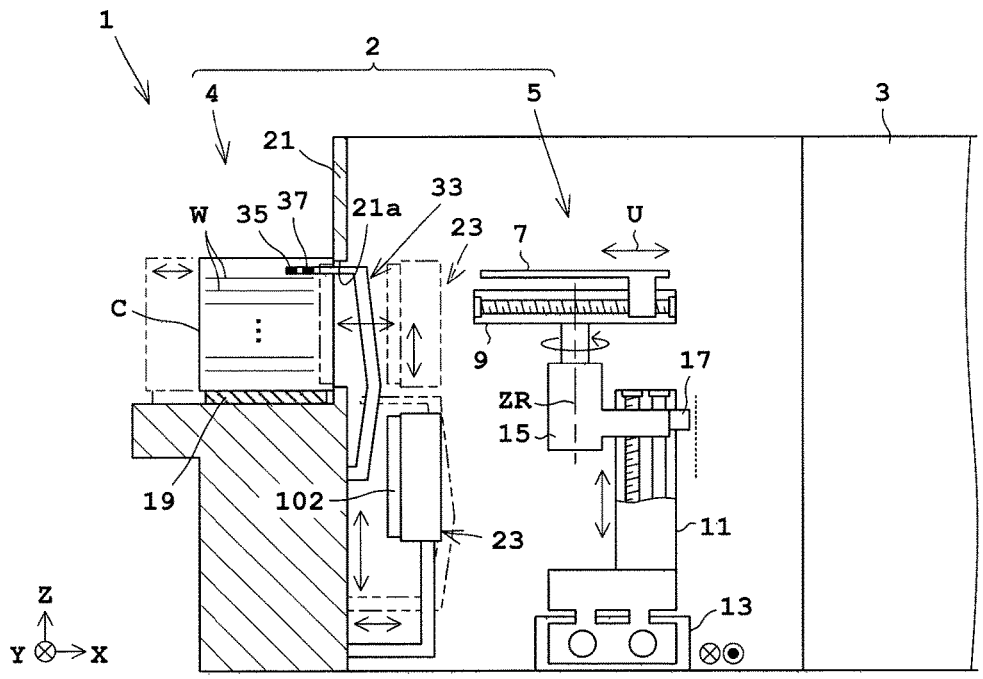
FIG. 1A is a side view showing an outline construction of a substrate treating apparatus according to Embodiment 1.
Figure 1B:
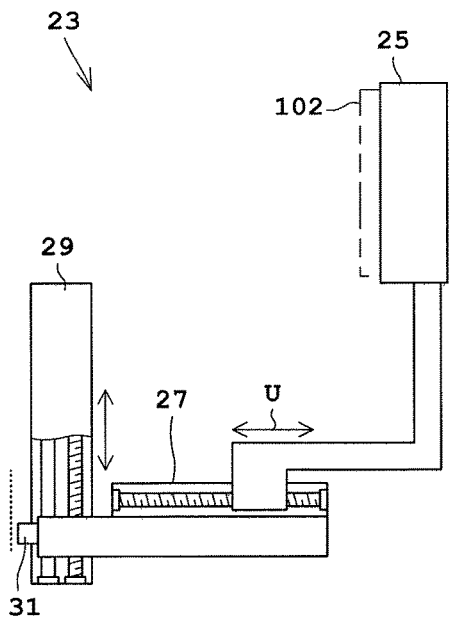
FIG. 1B is a side view of a lid attaching and detaching device.
Figure 1C:
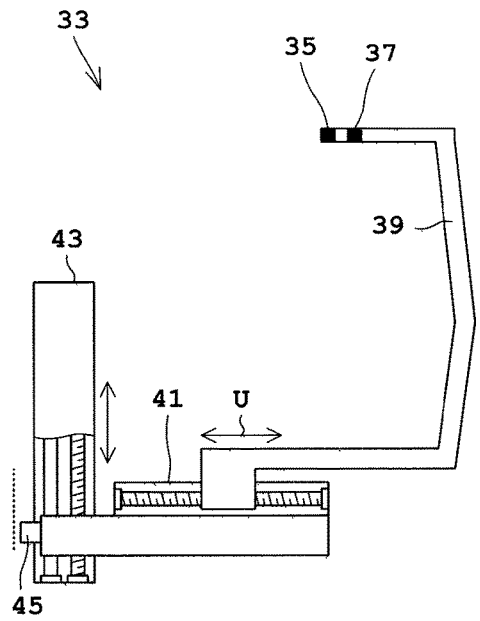
FIG. 1C is a side view of a mapping device.
Figure 2A:
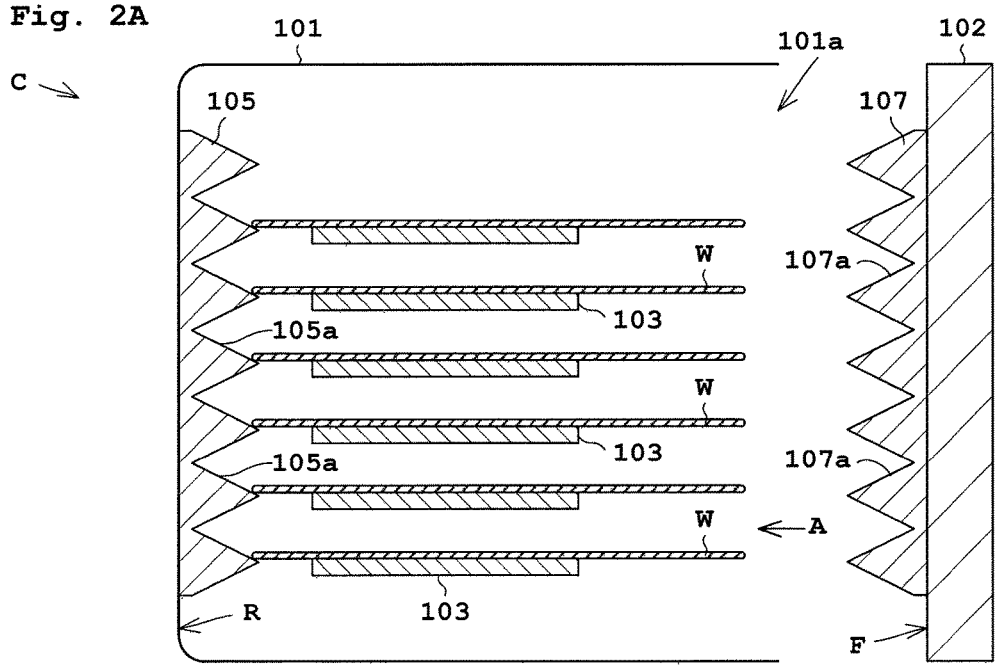
Figure 2B:
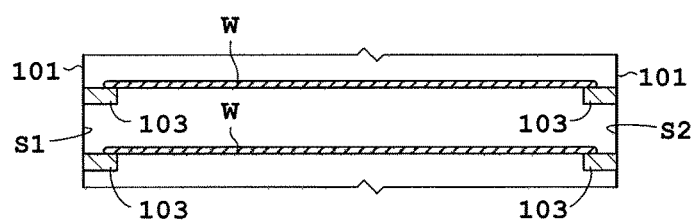
Figure 2C:
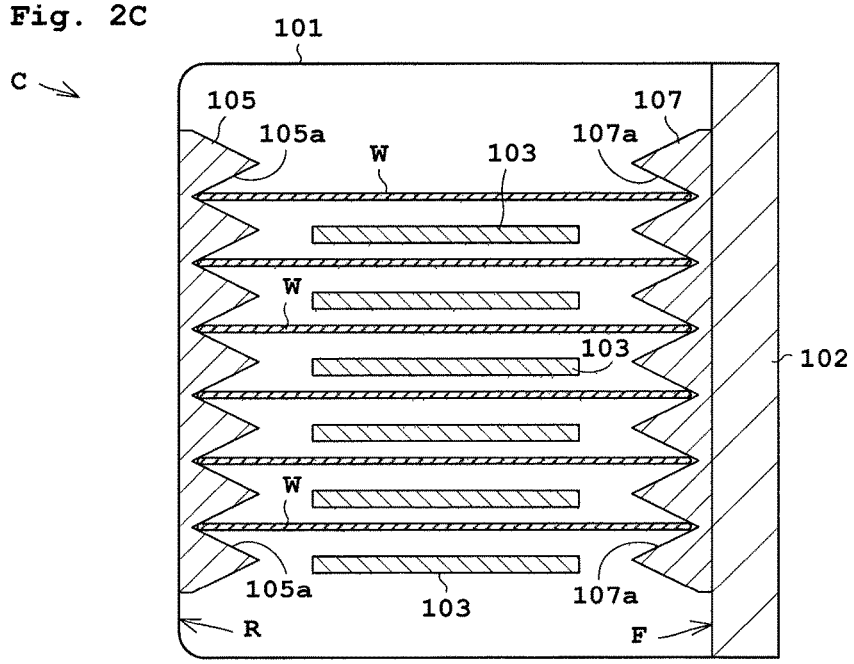
Figure 3:
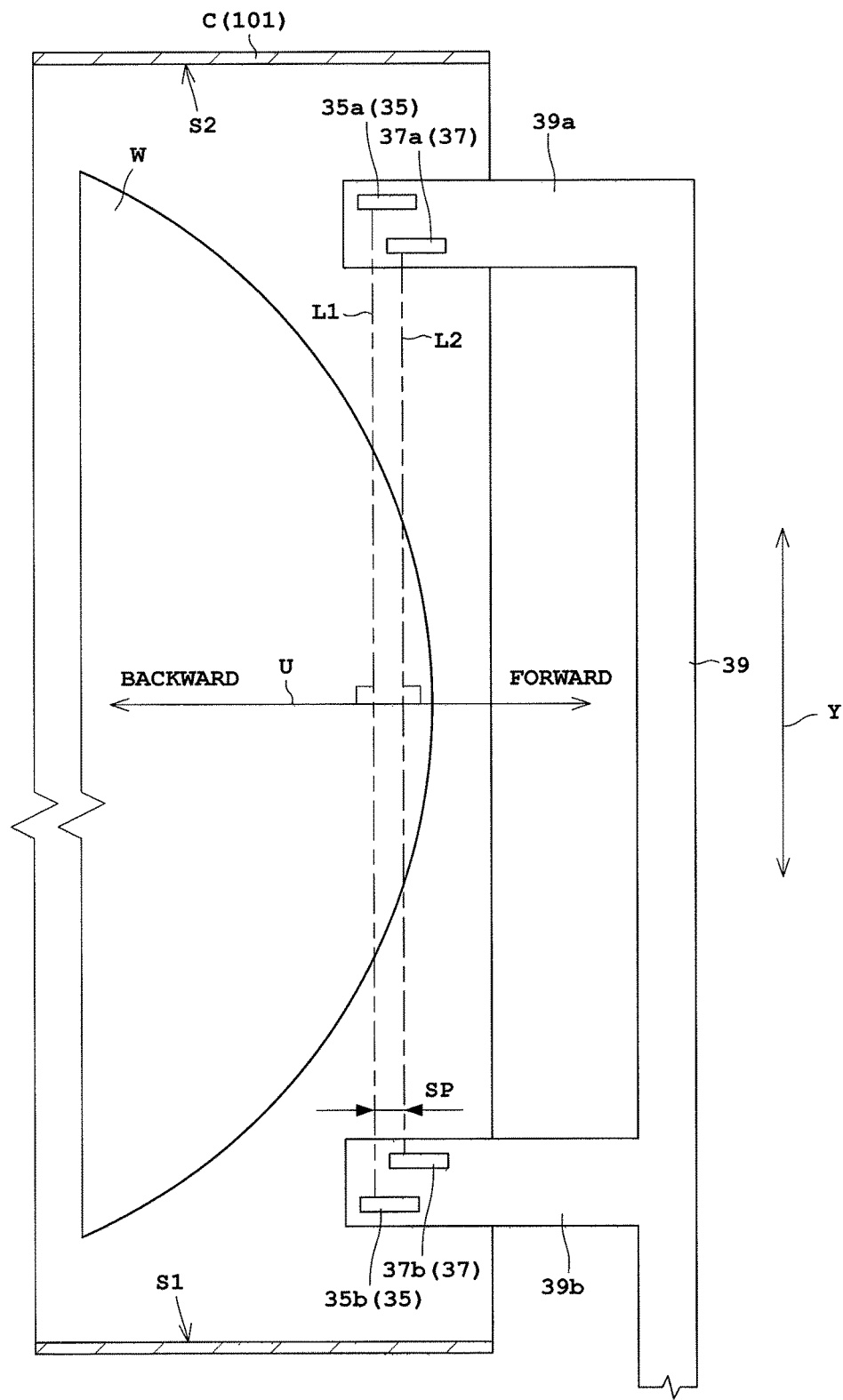
FIG. 3 is a plan view showing two sets of mapping sensors.

Embodiment 1 of this invention will be described hereinafter with reference to the drawings. FIG. 1A is a side view showing an outline construction of a substrate treating apparatus according to Embodiment 1. FIG. 1B is a side view of a lid attaching and detaching device. FIG. 1C is a side view of a mapping device. FIGS. 2A-2C are views showing an example of carrier. FIG. 3 is a plan view showing two sets of mapping sensors.

Referring to FIG. 1A, a substrate treating apparatus 1 includes an indexer section 2, and a treating section 3 for performing predetermined treatments of wafers W. The treating section 3 has one or more treating units for performing various substrate treatments such as resist coating treatment, developing treatment, cleaning treatment and heat treatment, for example.

The indexer section 2 has support tables 4 for receiving carriers C each for containing a plurality of wafers W, and a substrate transport mechanism (transport robot) 5 provided between the support tables 4 and treating section 3. The substrate transport mechanism 5 takes the wafers W out of the carrier C, transports the wafers W to the treating section 3, and deposits the wafers W unloaded from the treating section 3 in the carrier C.

The substrate transport mechanism 5 includes a hand 7 for holding wafers W, a hand advance/withdraw mover 9 for moving the hand 7 along a fore-and-aft direction U relative to the inside of the carrier C, and a hand lifting and lowering device 11 for moving the hand 7 up and down (along a Z-direction which is a vertical direction). The substrate transport mechanism 5 further includes a sideways mover 13 for moving the hand 7 sideways (along a Y-direction) along the plurality of (e.g. four) support tables 4, a vertical-axis rotor 15 disposed between the hand advance/withdraw mover 9 and the hand lifting and lowering device 11 for rotating the hand 7 about a vertical axis ZR, and a height sensor 17 for detecting heights of the hand 7.

In FIG. 1A, the hand 7 moves in the fore-and-aft direction U into and out of the carrier C. The direction in which the hand 7 takes the wafers W out of the carrier C is called forward. The direction in which the hand 7 puts the wafers W into the carrier C is called backward. The fore-and-aft direction U and an X-direction perpendicular to the Y-direction are substantially in agreement.

The substrate transport mechanism 5 may have a plurality of hands 7. In this case, the hand advance/withdraw mover 9 move the respective hands 7 in a way to avoid mutual interference. The hand advance/withdraw mover 9, sideways mover 13 and vertical-axis rotor 15 may be constructed of articulated arm mechanisms. For expediency of illustration, FIG. 1A shows leading ends of the hand 7 not reaching the carrier C. In practice, however, the leading ends of the hand 7 reach close to the deepest portion of the carrier C to be able to take out or deposit the wafers W. The hand advance/withdraw mover 9, sideways mover 13 and vertical-axis rotor 15 are driven by motors, speed reducers and so on. The height sensor 17 is formed of a linear encoder, rotary encoder or the like.

[Construction of Carrier]

The carrier C in this embodiment will now be described. The carrier C used here is called MAC (Multi Application Carrier). Reference is made to FIGS. 2A-2C. FIGS. 2A and 2C are side views of the carrier C. FIG. 2B is a front view showing part of the carrier C seen from sign A in FIG. 2A.

The carrier C includes a main container body 101, and a lid 102 for closing an opening 101a of the main container body 101, which lid 102 is attachable to and detachable from the main container body 101. The carrier C further includes side holders 103 provided on opposite side surfaces S1 and S2 in the main container body 101 for holding the wafers W placed thereon (see FIG. 2B), rear holders 105 provided on a rear surface R in the main container body 101 and having V-shaped grooves 105a formed therein, and front holders 107 formed on a surface F of the lid 102 facing the inside of the main container body 101 and having V-shaped grooves 107a formed therein.

The grooves 105a and 107a are not limited to the V-shape, but may be shaped otherwise to become progressively narrower as the grooves get deeper, such as U-shaped, for example.

With such carrier C, a holding state of the wafers W within the main container body 101 varies with attachment and detachment of the lid 102 to/from the main container body 101. Before the lid 102 is attached to the main container body 101 as shown in FIG. 2A, both side surfaces of each wafer W are placed on and supported by a pair of opposite side holders 103. When the lid 102 is inserted in the opening 101a and moved backward, each wafer W is clamped between a rear holder 105 and a front holder 107. And each wafer W is raised from the side holders 103 with edges of the wafer W sliding upward along slopes of the groove 105a of the rear holder 105 and the groove 107a of the front holder 107. When the lid 102 is completely inserted in the opening 101a, as shown in FIG. 2C, the lower surface of each wafer W is completely separated from upper surfaces of the side holders 103. The position of the wafers W at this time is called a fixed position of the wafers W.

When the lid 102 is detached from the opening 101a, each wafer W is placed in a horizontal position on the side holders 103 as shown in FIG. 2A, with the edges of each wafer W sliding downward along the slopes of the groove 105a of the rear holder 105 and the groove 107a of the front holder 107. The position of the wafers W at this time is called a takeout standby position.

[Construction of Support Tables]

Next, referring back to FIG. 1A, the support tables 4 will be described. A plurality of (e.g. four) support tables 4 are usually provided for one substrate treating apparatus 1. The support tables 4 are arranged outside a partition wall 21 of the substrate treating apparatus 1. Each support table 4 has a stage 19 for placing a carrier C thereon. The stage 19 is constructed movable back and forth relative to the partition wall 21 along the X-direction by a carrier moving mechanism not shown. When the carrier moving mechanism moves the stage 19 in the X-direction, the carrier C placed on the stage 19 can be moved toward and away from the partition wall 21. The support table 4 or stage 19 corresponds to the receiver in this invention.

The partition wall 21 has a passage opening 21a formed in a position thereof opposed to the carrier C and having substantially the same inside dimensions as the opening 101a of the carrier C. The substrate transport mechanism 5 is disposed in a position adjacent the treating section 3 and opposed to the passage opening 21a. The substrate transport mechanism 5 takes out and deposit the wafers W from/in the carrier C through the passage opening 21a. The passage opening 21a is usually closed by a shutter 25 of a lid attaching and detaching device 23 (to be described hereinafter) in order to seal off the interior of the substrate treating apparatus 1 from outside. When the carrier C is placed on the stage 19 and the carrier moving mechanism advances the carrier C to a position for contacting the partition wall 21, the shutter 25 of the lid attaching and detaching device 23 becomes removable from the passage opening 21a.

As shown in FIG. 1B, the lid attaching and detaching device 23 includes the shutter 25 for attaching and detaching the lid 102 to/from the main container body 101 and holding the lid 102 detached from the main container body 101, a lid advance/withdraw mover 27 for moving the shutter 25 in the fore-and-aft direction U, a lid lifting and lowering device 29 for moving the shutter 25 up and down, and a height sensor 31 for detecting heights of the shutter 25. The lid advance/withdraw mover 27 and lid lifting and lowering device 29 are driven by motors, speed reducers and so on. The height sensor 31 is formed of a linear encoder or rotary encoder, for example.

The lid attaching and detaching device 23 opens the passage opening 21a, detaches the lid 102 from the main container body 101 of the carrier C, and holds the lid 102. On the other hand, the lid attaching and detaching device 23 closes the passage opening 21a, attaches the lid 102 held to the opening 101a of the main container body 101, and seals the carrier C. The substrate treating apparatus 1 further includes a mapping device 33 disposed at the side of the passage opening 21a adjacent the treating section 3 to be operable separately from the lid attaching and detaching device 23.

The mapping device 33 of the substrate treating apparatus 1 in this invention includes two sets of mapping sensors 35 and 37 shown in FIG. 1C and FIG. 3. This construction detects, in two different locations in the fore-and-aft direction U, heights of each of the plurality of wafers W in the carrier C, and acquires a tilt of each wafer W based on the detected heights of each wafer W. By acquiring a tilt of each wafer W in advance, it is possible to prevent damage or the like of the wafers W resulting from contact between the hand 7 of the substrate transport mechanism 5 and the wafers W. The mapping device 33 and other components will be described specifically hereinafter.

Reference is made to FIG. 1C. The mapping device 33 includes the two sets of mapping sensors 35 and 37, a sensor support member 39 for supporting the two sets of mapping sensors 35 and 37, a sensor advance/withdraw mover 41 for moving the sensor support member 39 in the fore-and-aft direction U to advance and withdraw the mapping sensors 35 and 37 supported by the sensor support member 39 into/out of the carrier C through the opening 101a of the carrier C, a sensor lifting and lowering device 43 for moving the two sets of mapping sensors 35 and 37 up and down, and a height sensor 45 for detecting heights of the two sets of mapping sensors 35 and 37.

The sensor advance/withdraw mover 41, which advances and withdraws the mapping sensors 35 and 37, may move the two sets of mapping sensors 35 and 37 linearly along the fore-and-aft direction U as in FIG. 1C, for example. The sensor advance/withdraw mover 41 may swivel the two sets of mapping sensors 35 and 37 about a position set beforehand as the center of rotation. Further, the sensor advance/withdraw mover 41 may combine the linear movement and swiveling. In this case, the sensor advance/withdraw mover 41 either advances or withdraws the mapping sensors 35 and 37 into/from the carrier C through the opening 101a of the carrier C, and moves the two sets of mapping sensors 35 and 37 in the fore-and-aft direction U.

The sensor advance/withdraw mover 41 and sensor lifting and lowering device 43 are driven by motors, speed reducers and so on. The height sensor 45 is formed of a linear encoder or rotary encoder, for example. The sensor advance/withdraw mover 41 corresponds to the advance/withdraw mechanism in this invention. The sensor lifting and lowering device 43 corresponds to the up-and-down mechanism in this invention.

FIG. 3 is a plan view showing regions adjacent leading ends of the sensor support member 39. As shown in FIG. 3, leading end portions of the sensor support member 39 are bifurcated in the Y-direction to form a first leading end 39a and a second leading end 39b. The first leading end 39a and second leading end 39b are spaced in the Y-direction to such an extent as to receive a peripheral edge of each wafer W therebetween.

The two sets of mapping sensors 35 and 37 are formed of transmission type sensors, and have light transmitters 35a and 37a and light receivers 35b and 37b. Presence or absence of each wafer W is detected based on whether or not detecting lights L1 and L2 emitted from the light transmitters 35a and 37a are blocked by the wafer W. The light transmitters 35a and 37a are attached to the first leading end 39a, while the light receivers 35b and 37b are attached to the second leading end 39b. The mapping sensors 35 are arranged closer to the deep end of the carrier C than are the mapping sensors 37. The first detecting light L1 emitted from the light transmitter 35a toward the light receiver 35b is formed to be closer to the deep end of the carrier C than is the second detecting light L2 emitted from the light transmitter 37a toward the light receiver 37b. In the following description, a fore-and-aft position of the first detecting light L1 will be called the first fore-and-aft position u1, and a fore-and-aft position of the second detecting light L2 will be called the second fore-and-aft position u2. In this embodiment, a height h1 of each wafer W in the first fore-and-aft position u1 and a height h2 of each wafer W in the second fore-and-aft position u2 are detected based on height positions of the mapping sensors 35 and 37 when the detecting lights L1 and L2 are blocked by the wafer W.

The positions of arrangement of the light transmitters and light receivers may be reversed from those shown in FIG. 3. Thus, the light transmitters 35a and 37a may be attached to the second leading end 39b, and the light receivers 35b and 37b to the first leading end 39a.

FIG. 3 shows a state where the sensor advance/withdraw mover 41 has advanced the two sets of mapping sensors 35 and 37 into the carrier C, that is detecting positions in horizontal directions (XY directions) of the mapping sensors 35 and 37. Positions in the fore-and-aft direction of the mapping sensors 35 and 37 in the detecting positions are set to positions where both of the mapping sensors 35 and 37 can detect edges of each wafer W on standby for takeout from the carrier C.

The mapping sensors 35 and 37 of the mapping device 33 detect presence or absence of each wafer W by facing a horizontal direction that crosses the fore-and-aft direction U. The mapping sensors 35 and 37 are provided in two sets in order to detect presence or absence of each wafer W in different positions in the fore-and-aft direction U. The mapping sensors 35 and 37 correspond to the substrate detecting sensors in this invention.

Figure 4:
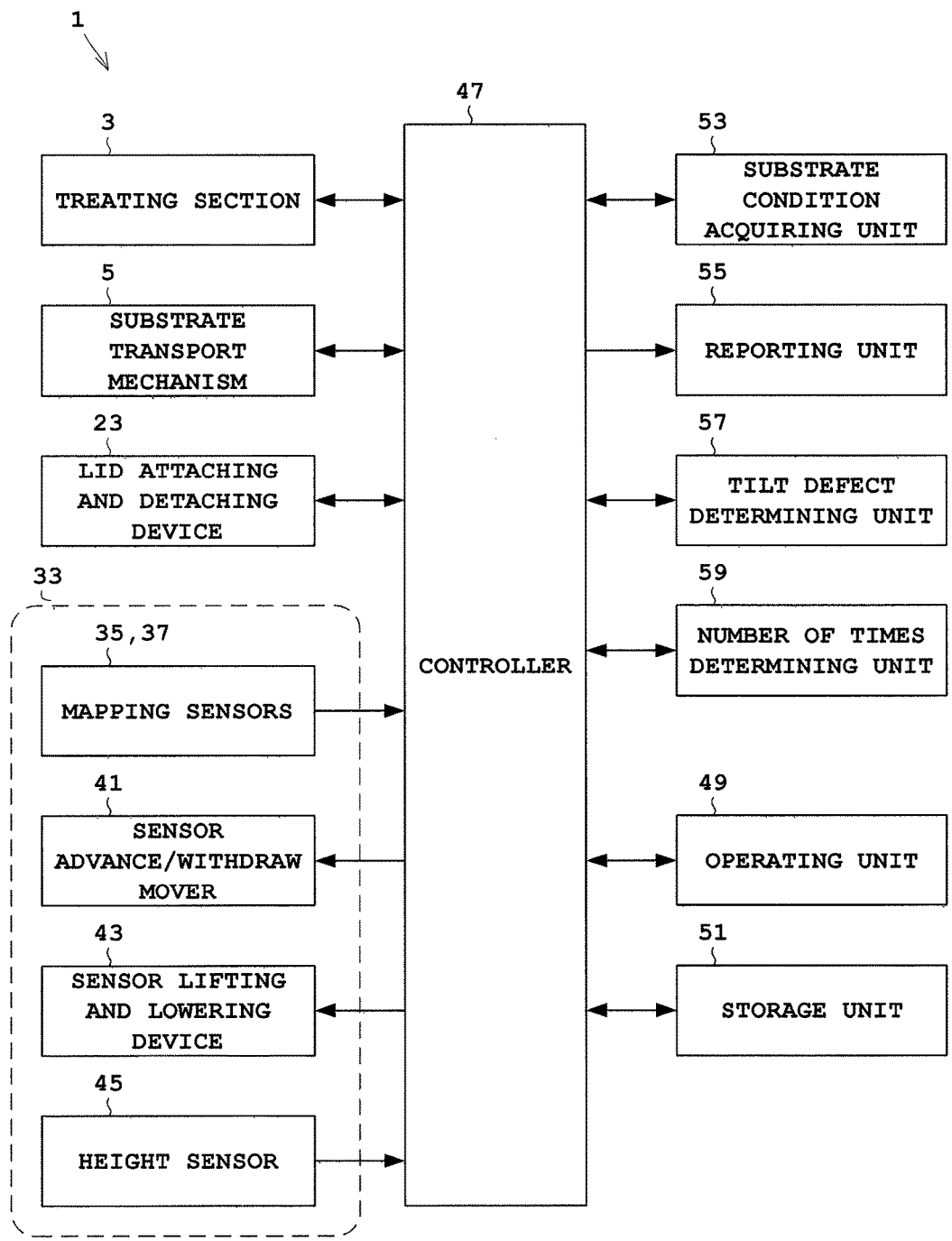
FIG. 4 is a block diagram showing a control system of the substrate treating apparatus.

FIG. 4 is a block diagram showing a control system of the substrate treating apparatus 1. The substrate treating apparatus 1 includes a controller 47 for performing overall control of the various components of the apparatus 1, an operating unit 49 for operating the substrate treating apparatus 1, and a storage unit 51 for storing information detected by the mapping sensors 35 and 37 and height sensor 45. The controller 47 is formed of a CPU (central processing unit) or the like. The operating unit 49 has a display such as an LCD monitor, and input devices such as a keyboard, a mouse and other switches, for example. The storage unit 51 is formed of storage media including a removable one, such as a ROM (Read-only Memory) and a RAM (Random-Access Memory) or a hard disk.

The substrate treating apparatus 1 further includes a substrate condition acquiring unit 53 for acquiring tilts of the wafers W with respect to the horizontal in the fore-and-aft direction U based on substrate heights in two locations detected by the mapping sensors 35 and 37 and height sensor 45, a tilt fault determining unit 57 for determining tilt faults of the wafers W based on whether a tilt (absolute value) or the like in the fore-and-aft direction U of each wafer W is larger than a threshold set beforehand, and a reporting unit 55 for reporting to the operator by sound and/or light on occurrence of tilt faults and holding positions of the wafers W having the tilt faults.

The storage unit 51 stores the holding positions of the wafers W having the tilt faults. A number of times determining unit 59 may be omitted from this embodiment, and the number of times determining unit 59 will be described hereinafter. The substrate condition acquiring unit 53, tilt fault determining unit 57 and number of times determining unit 59 are in form of hardware, software or a combination of hardware and software.

Figure 5:
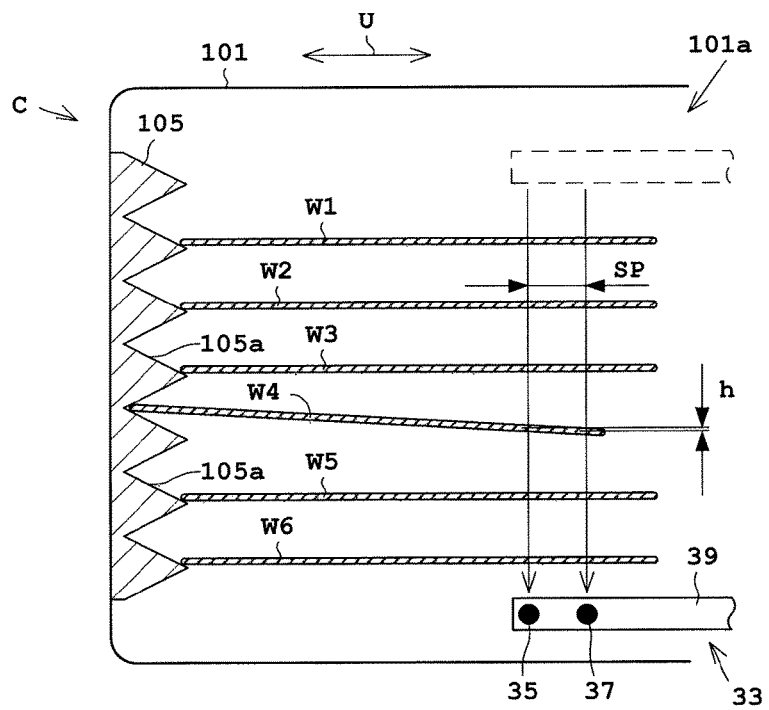
FIG. 5 is a view illustrating operation of the substrate treating apparatus according to Embodiment 1.

As shown in FIG. 5, the controller 47 operates the sensor advance/withdraw mover 41 to advance the two sets of mapping sensors 35 and 37 into the carrier C, and in this state operates the sensor lifting and lowering device 43 to move the two sets of mapping sensors 35 and 37 up and down. At this time, the controller 47 causes the two sets of mapping sensors 35 and 37 to detect presence or absence of the wafers W, and the height sensor 45 to detect heights of the two sets of mapping sensors 35 and 37, thereby to detect heights of each wafer W in two different locations in the fore-and-aft direction U.

One example of positional abnormality of a wafer W in the main container body 101 will be described hereinafter with reference to FIG. 6.

Figure 6:
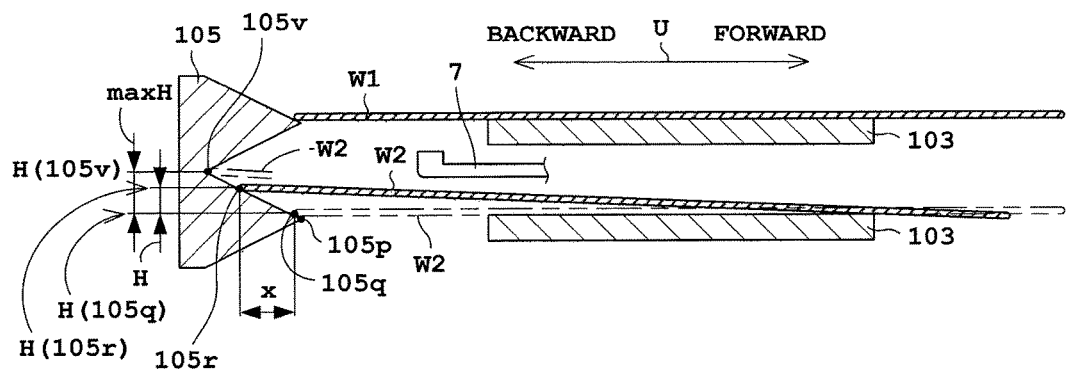
FIG. 6 is a view illustrating an example of trouble due to a positional abnormality of a substrate in a main container body.

FIG. 6 shows holding conditions of two wafers W1 and W2 placed on vertically adjacent side holders 103 in the main container body 101. Wafer W1 is in the takeout standby position. Wafer W2 has stopped halfway down the groove 105a of the rear holder 105 while descending from the fixed position toward the takeout standby position (two-dot chain line). That is, wafer W 1 is shown to be in a normal position, while wafer W 2 serves to illustrate an abnormal condition of its position.

Wafer W2 in the fixed position has its backward edge fixed by being contacted from above and below by the upward and downward slopes of the rear holding groove 105a. That is, the outermost backward edge of wafer W2 is located in a valley portion 105v of the rear holding groove 105a.

On the other hand, wafer W2 in the takeout standby position has the backward edge supported by the rear holding groove 105a at a normal supporting point 105q (in a position close to and above a peak portion 105p of the rear holding groove 105a).

When wafer W2 descends normally from the fixed position toward the takeout standby position, the outermost backward edge of wafer W2 descends from height position H (105v) of the valley portion 105v to height position H (105q) of the normal supporting point 105q. The difference between height position H (105v) and height position H (105q) is called a normal height difference maxH.

Wafer W1 located over wafer W2 is raised and taken out of the main container body 101 by the hand 7 having moved in the horizontal direction U from the opening 101a of the main container body 101 toward the deep end of the main container body 101 and advanced between wafer W1 and wafer W2. That is, the hand 7 moves in the horizontal direction U until the leading ends thereof reach near the deepest portion of the main container body 101. Next, the leading ends of the hand 7 move up and raise wafer W1 from the side holders 103. The hand 7 then withdraws in the horizontal direction U, and takes wafer W1 out of the main container body 101.

As described above, when the hand 7 is inserted between wafer W1 and wafer W 2, sufficient space is needed between wafer W1 to be taken out and wafer W2 directly thereunder. This is because, if the vertical clearance between the wafers W1 and W2 is small, there is a possibility of the hand 7 contacting and damaging the upper surface of the lower wafer W2 during movement toward the deep end of the main container body 101. Whether there is sufficient clearance between wafer W1 to be taken out and wafer W2 directly thereunder can be determined based on height position H (105r) of the supporting point 105r for wafer W2. Supporting point height H (105r) is shown by a difference in the height direction between supporting point height H (105r) and normal supporting point height H (105q), i.e. height difference H. The larger height difference H means the higher possibility of the hand 7 contacting wafer W2. However, a height difference H large enough to keep the hand 7 out of contact with the surface of wafer W2 is permissible. So this embodiment employs a maximum height difference H with no possibility of the hand 7 contacting the surface of wafer W2 as threshold (permissible value) of height difference H. It is also possible to prevent contact between the hand 7 and wafer W2 beforehand by correcting an advancing track of the hand 7 so that the hand 7 advance above a horizontal plane defined by height difference H.

In the case of large height difference H, there is a possibility of the backward edge of wafer W2 contacting the upward slope of the rear holding groove 105a at the time wafer W2 is taken out. The threshold (permissible value) of height difference H can also be set to such a size as to avoid the backward edge of wafer W2 contacting the upward slope of the rear holding groove 105a. An amount of uplift at the time the hand 7 raises wafer W2 may also be adjusted based on the size of height difference H, whereby it is made possible to prevent the backward edge of wafer W2 from contacting the upward slope of the rear holding groove 105a when the hand 7 raises wafer W2.

Figure 7A:
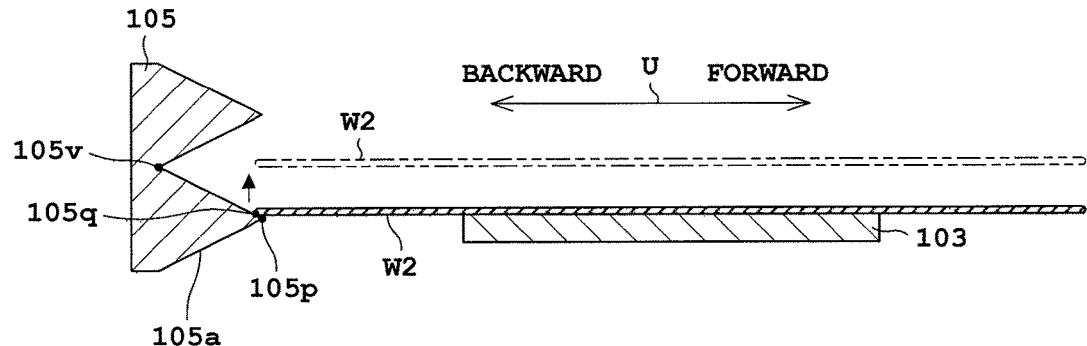
FIGS. 7A and 7B are views illustrating other examples of trouble due to positional abnormalities of substrates in the main container body.

Next, another instance of trouble that can accompany a positional abnormality of a wafer W will be described with reference to FIGS. 7A and 7B. When the hand 7 raises a wafer W and takes the wafer W out of the main container body 101 as in this embodiment, sufficient space needs to be secured above the backward edge of the wafer W 2 to be taken out. Consider a state of wafer W2 being in the takeout standby position as shown in FIG. 7A. As described above, the outermost backward edge of wafer W2 in the takeout standby position is supported at normal supporting point 105q. Since this normal supporting point 105q is close to and above the peak portion 105p of the rear holding groove 105a, sufficient space exists directly above the normal supporting point 105q. The hand 7 can therefore safely raise wafer W2 in the takeout standby position to a height shown in two-dot chain lines without contacting the rear holding groove 105a.

Figure 7B:
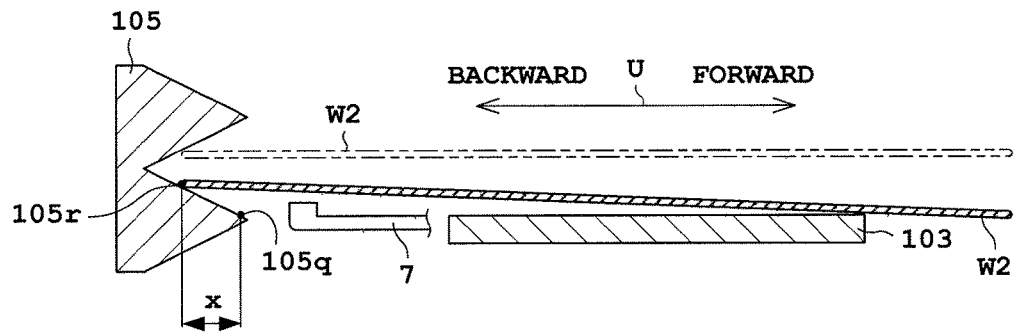

On the other hand, when wafer W2 has stopped in a position tilting forward from the fixed position as shown in FIG. 7B, the outermost backward edge of wafer W2 stops in a position displaced backward from the normal supporting point 105q. Let an amount of this displacement in a horizontal direction be a depth displacement amount x. The larger the depth displacement amount x is, the deeper in the rear holding groove 105a the backward edge of wafer W2 is located. This poses a high possibility of wafer W2 contacting the rear holding groove 105a to be damaged when the hand 7 raises wafer W2. However, the depth displacement amount x is permissible if it is small enough to keep the edge of wafer W2 out of contact with the rear holding groove 105a when the hand 7 raises wafer W 2. So this embodiment employs a maximum depth displacement amount x with no possibility of the edge of wafer W2 contacting the slope of the rear holding groove 105a when the hand 7 raises wafer W 2, as threshold (permissible value) of the depth displacement amount x.

By correcting a moving track of the hand 7 based on the size of the depth displacement amount x, it is also possible to prevent the edge of wafer W2 from contacting the slope of the rear holding groove 105a when the hand 7 raises wafer W2.

Further, the larger the depth displacement amount x of wafer W2 is, the higher becomes the possibility that the hand 7 contacts wafer W2 when taking out wafer W1 directly over wafer W2. The threshold (permissible value) of the depth displacement amount x of wafer W2 may therefore be set to a maximum amount without a possibility that the hand 7 taking out wafer W1 contacts wafer W2.

By correcting the moving track of the hand 7 based on the size of the depth displacement amount x, it is possible to prevent the hand 7 advancing between wafer W1 and wafer W2 in order to take out wafer W1 from contacting wafer W2.

Figure 8:
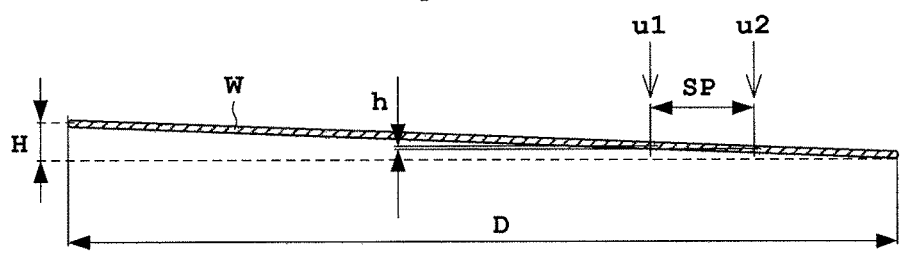
FIG. 8 is a view illustrating a method of calculating an amount of backward displacement of a substrate.

Next, an example of method of calculating height difference H and depth displacement amount x will be described with reference to FIGS. 6 and 8 and following equations (1)-(4).

Distance D is a horizontal distance from substrate supporting point 105r to an outermost front edge of a wafer W. Distance D can use the diameter of the wafer W as an approximate value thereof (e.g. 450 mm). Distance SP is a horizontal distance between a first fore-and-aft position u1 and a second fore-and-aft position u2, i.e. a sensing pitch (e.g. 30 mm). Sign h is a difference between detection heights of the wafer W by the mapping sensors 35 and 37 (e.g. 3.5 mm). With these elements, calculations may be made as in the following equations (1)-(4). That is, the relationship of equation (4) is obtained by rewriting the relationship of equation (1) to equation (2) and rewriting the relationship of equation (3) and substituting it into equation (2).

$$450:H=30:h \quad (1)$$

$$H=450 \times h/30 \quad (2)$$

$$H:x=3.5:3 \quad (3)$$

$$\begin{aligned}x &= 3 \times H/3.5 \\ &= 3 \times 450 \times h/30/3.5\end{aligned} \quad (4)$$

Thus, based on detection height difference h, height difference H and depth displacement amount x of the wafer W to be detected can be acquired through simple calculations.

The substrate condition acquiring unit 53 acquires a tilt of each wafer W relative to the horizontal in the fore-and-aft direction U based on substrate heights in two different locations in the fore-and-aft direction U detected by the mapping sensors 35 and 37 and height sensor 45. The tilt defect determining unit 57 acquires height difference H and depth displacement amount x of the wafer W by applying the tilt of the wafer W acquired by the substrate condition acquiring unit 53 to equations (1) through (4), for example. Then, whether each wafer W has a tilt defect or not is determined by comparing height difference H and depth displacement amount x with their respective thresholds.

The height difference H and depth displacement amount x are calculated for all the wafers W contained in the carrier C each time a mapping operation is performed. However, instead of performing the calculations with each mapping operation, a table correlating detection height difference h with at least one of height difference H and depth displacement amount x may be prepared beforehand so that detecting height difference h detected in a mapping operation may be applied to the table whereby the table outputs height difference H and depth displacement amount x.

[Operation of Substrate Treating Apparatus]

Next, operation of the substrate treating apparatus 1 will be described. Referring to FIG. 1A, a carrier C is transported to the substrate treating apparatus 1 by a robot not shown, for example, and is placed on a stage 19. At this time, the stage 19 is spaced from the partition wall 21. When the carrier C has been placed on the stage 19, the stage 19 moves the carrier C toward the partition wall 21. Consequently, the outer surface adjacent the lid 102 of the carrier C makes close contact with the partition wall 21.

When the outer surface adjacent the lid 102 of the carrier C is in close contact with the partition wall 21 of the substrate treating apparatus 1, the shutter 25 of the lid attaching and detaching device 23 blocking the passage opening 21a will hold the lid 102 of the carrier C. The shutter 25 unlocks the lid 102 from the main container body 101 by turning a dial, not shown, of the lid 102. Next, the shutter 25 holding the lid 102 moves toward the treating section 3, whereby the lid attaching and detaching device 23 detaches the lid 102 from the main container body 101. The shutter 25 moves downward adjacent the treating section 3 to move the lid 102 to a "release position" below the passage opening 21a. The sensor advance/withdraw mover 41 of the mapping device 33, after the lid 102 is detached, advances the mapping sensors 35 and 37 into the carrier C through the opening 101a of the carrier C.

The controller 47 in FIG. 4 controls a mapping operation as follows. With the mapping sensors 35 and 37 having advanced into the carrier C, the controller 47 operates the sensor lifting and lowering device 43 to move the mapping sensors 35 and 37 in the vertical direction. In the example shown in FIG. 5, six wafers W1-W6 are placed in the carrier C. The controller 47 moves the mapping sensors 35 and 37 once from top down, from a height position above the uppermost wafer W1 in the carrier C to a height position below the lowermost wafer W6. The detecting direction may be from bottom up. During this movement, the mapping sensors 35 and 37 detect presence or absence of the wafers W. Substrate height is detected in two different locations in the fore-and-aft direction U by referring to signals of the height sensor 45 at a point of time the mapping sensors 35 and 37 detect each wafer W. At this time, the number and holding positions of the wafers W contained in the carrier C are also detected.

The substrate condition acquiring unit 53 acquires a tilt of each wafer W relative to the horizontal in the fore-and-aft direction U based on heights of the wafer W in two different locations in the fore-and-aft direction U. The tilt defect determining unit 57 determines from the tilt of the wafer W whether the wafer W is fit for takeout or not.

In the example shown in FIG. 5, only wafer W4 is not located in a position capable of being taken out, but is in a position tilting forward. Assume here that height difference H of wafer W4 exceeds the threshold. In this case, the tilt defect determining unit 57 determines from the extent of difference H that one or both of wafers W3 and W4 cannot be taken out (takeout prohibited). Or it is assumed that the depth displacement amount x of wafer W4 exceeds the threshold. In this case, the tilt defect determining unit 57 determines from the extent of amount x that one or both of wafers W3 and W4 cannot be taken out.

Thus, the tilt defect determining unit 57 can determine individually whether a tilting wafer W and a wafer W thereabove are fit for takeout or not, by referring to two or more thresholds.

The storage unit 51 stores tilt defects and unloading appropriateness of wafers W determined in this way. The controller 47 refers to the information stored in the storage unit 51, and creates a takeout schedule of the plurality of wafers W contained in the carrier C. When tilt defects of the wafers W have been determined, the controller 47 may inform the operator through the reporting unit 55 of the presence, number and holding positions in the carrier C of wafers W that cannot be taken out.

After the tilt of the wafer W is acquired, the sensor advance/withdraw mover 41 withdraws the mapping sensors 35 and 37 from inside the carrier C, and the sensor lifting and lowering device 43 moves the mapping sensors 35 and 37 further downward. Consequently, the mapping sensors 35 and 37 and so on of the mapping device 33, as done by the lid attaching and detaching device 23, are withdrawn to the position not to obstruct takeout and depositing of the wafers W. After the mapping device 33 is withdrawn, the substrate transport mechanism 5 takes out the wafers W in order based on results of determination by the tilt defect determining unit 57.

That is, the controller 47 refers to the information stored in the storage unit 51, and moves the hand 7 to positions opposed to the wafers W that can be taken out of the carrier C. When, for example, there is a wafer W determined by the tilt defect determining unit 57 to have a large tilt, the substrate transport mechanism 5 once suspends the operation for taking out the wafers W, and the reporting unit 55 reports this to the operator. The tilt in the fore-and-aft direction U of the wafer W inside the carrier C is acquired in advance, thereby to be able to prevent substrate damage due to contact between the hand 7 of the substrate transport mechanism 5 and the wafer W or contact between the rear holding groove 105a and the wafer W.

The wafers W transported to the treating section 3 receive predetermined treatment in the treating section 3. When all the wafers W have been returned to the carrier C, the lid attaching and detaching device 23 attaches the lid 102 to the opening 101a of the main container body 101 of the carrier C, locks the lid 102 to the main container body 101, and seals the passage openings 21a. The stage 19 moves away from the partition wall 21, and releases the carrier C. The carrier C is transported to a next apparatus.

According to this embodiment, in the state of the mapping sensors 35 and 37 having been advanced into the carrier C by the sensor advance/withdraw mover 41, the sensor lifting and lowering device 43 moves the mapping sensors 35 and 37 up and down. With this movement, the mapping sensors 35 and 37 detect presence or absence of the wafers W in a horizontal direction crossing the fore-and-aft direction U for moving the wafers W into and out of the carrier C, and the height sensor 45 detects heights of the mapping sensors 35 and 37. Consequently, substrate heights are detected in two different locations in the fore-and-aft direction U. The substrate condition acquiring unit 53 acquires a tilt of each wafer W relative to the horizontal in the fore-and-aft direction U based on the substrate heights in the two different locations in the fore-and-aft direction U. The tilt of each wafer W inside the carrier C is acquired in advance, thereby to be able to prevent substrate damage due to contact between the hand 7 of the substrate transport mechanism 5 and the wafer W or contact between the rear holding groove 105a and the wafer W.

With the mapping sensors 35 and 37 provided in two sets, the number of mapping sensors 35 and 37 increases. However, the number of times of movement by the sensor lifting and lowering device 43, i.e. the number of scans, can be reduced.

When the lid 102 blocking the opening 101a of the main container body 101 in FIG. 2A is removed, a wafer W may not properly slide down from the groove 105a of the rear holder 105 but may stop in a forwardly tilting condition. Even in such a case, the tilt in the fore-and-aft direction U of the wafer W inside the carrier C is acquired in advance, thereby to be able to prevent contact between the hand 7 of the substrate transport mechanism 5 and the wafer W. It is also possible to prevent damage of the wafer W done by contact between the rear holding groove 105a and the wafer W.

This embodiment employs a mode that acquires depth displacement amounts x of the wafers W based on the tilt conditions of the wafers W. The depth displacement amounts x of the plurality of wafers W arranged vertically can be acquired en bloc in a short time only by scanning the mapping sensors 35 and 37 up and down.

Since the tilt conditions of the wafers W can be acquired by detecting presence or absence of each wafer W in two arbitrary points in the fore-and-aft direction U, there is also an advantage of securing a high degree of freedom concerning installation positions of the mapping sensors 35 and 37.

EMBODIMENT 2

Next, Embodiment 2 of this invention will be described with reference to the drawings. Description that overlaps Embodiment 1 will be omitted. A substrate treating apparatus 1 in Embodiment 2 counts, for each carrier C, information on tilt defects and takeout appropriateness of wafers W determined by the tilt defect determining unit 57, and when the number of times set beforehand has been reached, reports that the carriers C should be changed.

In FIG. 4, the substrate treating apparatus 1 includes a number of times determining unit 59 for determining whether the information on tilt defects and unloading appropriateness of wafers W accumulated in the storage unit 51 has reached the number of times set beforehand. The storage unit 51, when the tilt defect determining unit 57 determines that the tilts are large, accumulates so determined tilt defect information for each carrier C.

Operation of the substrate treating apparatus 1 in Embodiment 2 will be described. As shown in FIG. 5, the controller 47 moves the mapping sensors 35 and 37 up and down to detect substrate heights in two different locations in the fore-and-aft direction U. Based on the substrate heights in the two locations, the substrate condition acquiring unit 53 acquires tilts in the fore-and-aft direction U of the wafers W.

The tilt defect determining unit 57 determines whether the tilts of the wafers W are larger than a threshold set beforehand. When the tilt defect determining unit 57 determines that the tilts are larger, the storage unit 51 accumulates so determined tilt defect information for each carrier C. The number of times determining unit 59 determines whether the tilt defect information accumulated in the storage unit 51 has reached the number of times set beforehand. When the number of times determining unit 59 determines that the information has reached the set number of times, the reporting unit 55 reports this fact.

The number of times determining unit 59 may determine whether tilt defect information accumulated with respect to any one of the plurality of substrate holding positions (e.g. the fifth stage from top) has reached a number of times (e.g. five times) set beforehand. Alternatively, the number of times determining unit 59 may determine whether a total T of the tilt defect information accumulated with respect to all the substrate holding positions has reached a number of times (e.g. 10 times) set beforehand. Total T of the tilt defect information accumulated with respect to all the substrate holding positions, when there are 25 stages of substrate holding positions, is expressed by the following equation (5), for example:

$$\text{Total } T = \text{number of times for the first stage} + \text{number of times for the second stage} + \ldots + \text{number of times for the 25th stage} \quad (5)$$

This embodiment can determine deteriorations with age of the carriers C, and inform the operator of timing of carrier changes.

Figure 9:
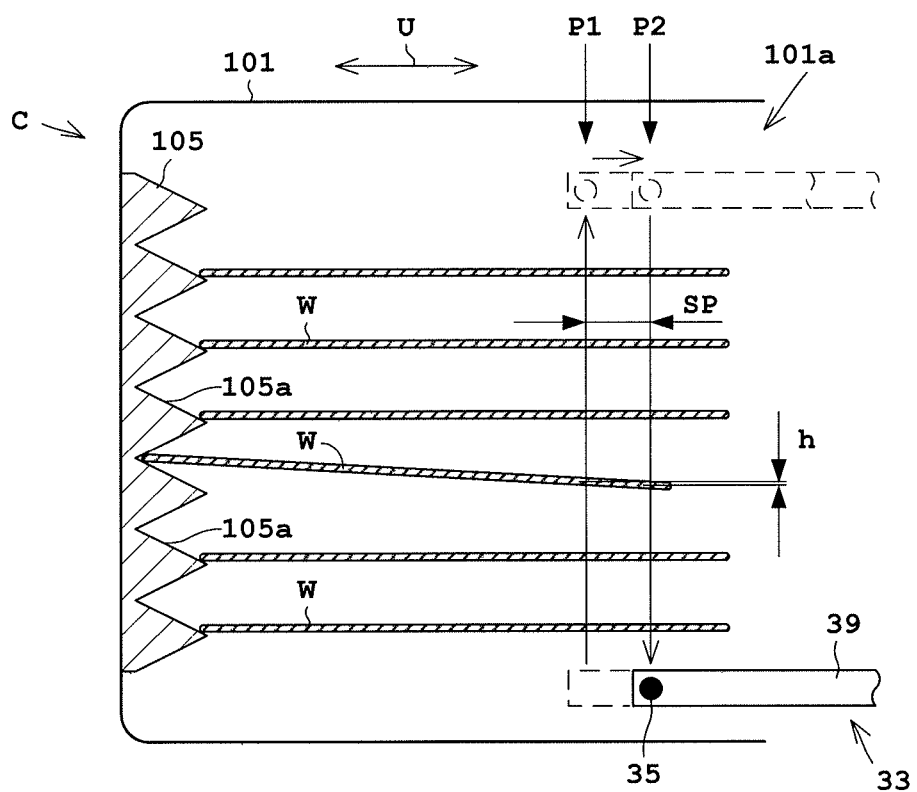
FIG. 9 is a view illustrating the operation of a substrate treating apparatus according to a modified embodiment.

This invention is not limited to the foregoing embodiments, but may be modified as follows:

(1) In each foregoing embodiment, the mapping sensors 35 and 37 are provided in two sets in order to detect substrate heights in two different locations in the fore-and-aft directions U. The invention is not limited to this. As shown in FIG. 9, for example, one set of mapping sensors may be provided, which is moved vertically in each of two different locations in the fore-and-aft directions U to detect substrate heights in the two locations.

The controller 47 operates the sensor advance/withdraw mover 41 to advance the mapping sensors 35 into the carrier C, in this state operates the sensor advance/withdraw mover 41 to move the mapping sensors 35 to move to the two different locations in the fore-and-aft directions U, and operates the sensor lifting and lowering device 43 to move the mapping sensors 35 up and down in each of positions (locations) P1 and P2. During this operation, the mapping sensors 35 detect presence or absence of the wafers W, and the height sensor 45 detects heights of the mapping sensors 35, thereby to detect heights of the wafers W in the two different locations in the fore-and-aft direction U.

That is, in FIG. 9, the mapping sensors 35 in position P1 in the fore-and-aft direction U are moved from bottom up, for example, to detect the height of each wafer W. Then the mapping sensors 35 are moved to position P2 in the fore-and-aft direction U, and are moved in this position P2 from top down to detect the height of each wafer W. Consequently, heights of all the wafers W in the carrier C are detected in the two different locations in the fore-and-aft direction U. Note that the number and positions of the wafers W are also detected.

According to this modification, the mapping sensors 35 are moved to the two different locations in the fore-and-aft directions U, and are moved by the sensor lifting and lowering device 43 in each of the two locations. It is therefore possible to set arbitrarily a distance between the two locations for height detection and the number of times of detection. Thus, the invention is applicable also to the apparatus having only one set of mapping sensors 35, for example.

(2) In each foregoing embodiment, the mapping sensors 35 and 37 are provided in two sets. The mapping sensors may be provided in three or more sets. Modification (1) described above provides one set of mapping sensors 35, but two or more sets of mapping sensors may be provided. The two or more sets of mapping sensors may be moved up and down to detect substrate heights in two or more different locations in the fore-and-aft direction U. When substrate heights are detected in the two or more different locations in the fore-and-aft direction U, the substrate condition acquiring unit 53 may, for example, select two arbitrary locations from among the two or more different locations to acquire tilts of the wafers W.

Figure 10:
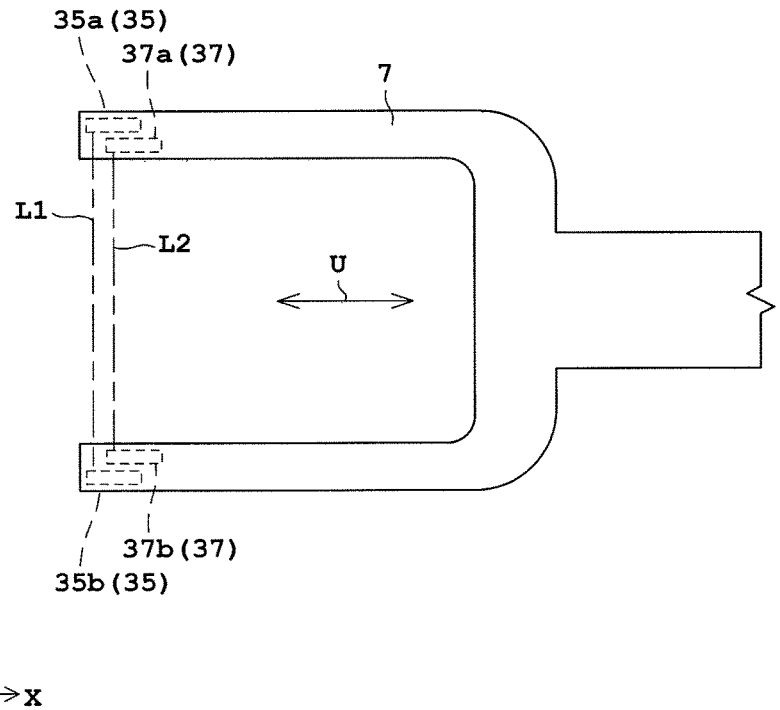
FIG. 10 is a view showing a hand of a substrate transport mechanism according to a modified embodiment.

(3) In each embodiment and each modification described above, one or more sets of mapping sensors are included in the mapping device 33 which operates separately from the lid attaching and detaching device 23. Instead of being included in the mapping device 33, the mapping sensors may be included in a different component. As shown in FIG. 10, for example, two sets of mapping sensors 35 and 37 may be provided at the leading ends of the hand 7 of the substrate transport mechanism 5. In this case, the hand advance/withdraw mover 9 corresponds to the advance/withdraw mechanism in this invention. The hand lifting and lowering device 11 corresponds to the up-and-down mechanism in this invention.

Figure 11:
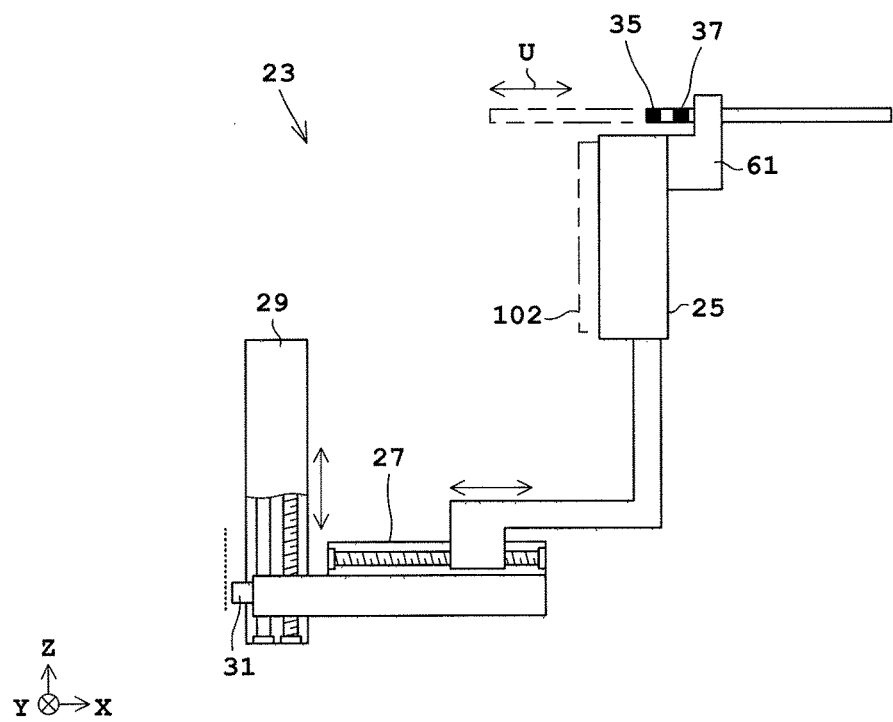
FIG. 11 is a view showing a lid attaching and detaching device according to a modified embodiment.

Further, as shown in FIG. 11, for example, the lid attaching and detaching device 23 may include a sensor advance/withdraw mover 61 for moving the mapping sensors 35 and 37 in the fore-and-aft direction U. In this case, the sensor advance/withdraw mover 61 corresponds to the advance/withdraw mechanism in this invention. The lid lifting and lowering device 29 corresponds to the up-and-down mechanism in this invention. The sensor advance/withdraw mover 61 may swivel the two sets of mapping sensors 35 and 37 about a position set beforehand as the center of rotation. The sensor advance/withdraw mover 61 may combine linear movement and swiveling.

(4) In each embodiment and each modification described above, the carrier C used is a MAC as shown in FIGS. 2A-2C, but this is not limitative. For example, the carrier C may be a FOUP (Front Open Unified Pod). In this case, the apparatus detects forward tilting conditions and backward tilting conditions of the wafers W occurring with variations of holding positions due to variations with age of support members (not shown) of the FOUP which correspond to the side holders 103 in FIGS. 2A-2C. The backward tilting conditions refer to conditions of the wafers W being lower at the deep sides than at the sides adjacent the opening 101a. The invention is applicable to any carrier C having formations like the grooves 105a of the rear holders 105 in FIG. 2A, in which the wafers W ride on such grooves to bring about forward tilting conditions.

(5) In foregoing Embodiment 2, the storage unit 51 accumulates tilt defect information for each carrier C, but may accumulate tilt defect information for each substrate holding position in the carrier C. And the number of times determining unit 59 determines whether tilt defect information for any one of the substrate holding positions accumulated in the storage unit 51 has reached the number of times set beforehand, and when the information is determined to have reached the set number of times, the reporting unit 55 reports the result of determination. With this modification, when a tilt defect occurring in a particular substrate holding position is due to a misteaching at a preceding stage of the substrate transport mechanism of the substrate treating apparatus, for example, the misteaching may be corrected or a calibration function may be provided in response to the report.

(6) In each embodiment and each modification described above, the substrate condition acquiring unit 53, reporting unit 55, tilt defect determining unit 57 and number of times determining unit 59 may be provided for the support tables 4. The controller 47, operating unit 49 and storage unit 51 may be provided for both the substrate treating apparatus 1 and support tables 4.

(7) Each embodiment and each modification described above employ a detection mode by light for the mapping sensors 35 and 37. Other detection modes such as by sound wave may be employed. Further, the transmission type detection mode may be replaced by a reflection type detection mode.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
    a receiver for receiving a carrier placed thereon, the carrier being constructed to contain a plurality of substrates;
    a substrate detecting sensor facing a horizontal direction crossing a fore-and-aft direction in which the substrates are moved into and out of the carrier, to detect presence or absence of each substrate;
    a height sensor for detecting heights of the substrate detecting sensor;
    an up-and-down mechanism for moving the substrate detecting sensor up and down;
    an advance/withdraw mechanism for moving the substrate detecting sensor in the fore-and-aft direction;
    a controller for causing the substrate detecting sensor to detect presence or absence of each substrate and causing the height sensor to detect heights of the substrate detecting sensor for detecting heights of each substrate in at least two different locations in the fore-and-aft direction by operating the up-and-down mechanism to move the substrate detecting sensor up and down, and operating the advance/withdraw mechanism to move the substrate detecting sensor in the fore-and-aft direction; and
    a substrate condition acquiring unit for acquiring a tilt of each substrate relative to a horizontal plane in the fore-and-aft direction based on a difference in heights of each substrate detected in the at least two different locations.

2. The substrate treating apparatus according to claim 1, further comprising:
    a tilt defect determining unit for determining whether tilts of the substrates are larger than a threshold set beforehand;
    a storage unit for accumulating tilt defect information on the tilts determined larger by the tilt defect determining unit, for each carrier or for each substrate holding position;
    a number of times determining unit for determining whether the tilt defect information accumulated in the storage unit has reached a number of times set beforehand; and
    a reporting unit for reporting that the tilt defect information has reached the number of times when the number of times determining unit determines so.

3. The substrate treating apparatus according to claim 1, wherein the substrate condition acquiring unit is configured to acquire an amount of horizontal substrate displacement toward a deep end of the carrier based on the tilt of each substrate relative to the horizontal plane in the fore-and-aft direction.

4. The substrate treating apparatus according to claim 3, wherein the carrier includes:
    a main container body;
    a lid attachable to and detachable from the main container body for blocking an opening of the main container body;
    side holders provided on opposite side surfaces in the main container body for supporting the substrates;
    rear holders provided on a rear surface in the main container body, and having grooves formed therein; and
    front holders provided on a surface of the lid facing inside of the main container body, and having grooves formed therein;
    wherein the rear holders and the front holders are configured to clamp the substrates therebetween while moving the substrates away from the side holders when the lid is attached to the opening of the main container body.

5. The substrate treating apparatus according to claim 4, further comprising:
    a hand for raising the substrates placed on the side holders and transporting the substrates out of the carrier;
    wherein a threshold is set for the amount of horizontal substrate displacement toward the deep end of the carrier to prevent backward edges of the substrates from contacting the grooves of the rear holders when the hand raises the substrates.

6. The substrate treating apparatus according to claim 5, wherein the controller is configured to prohibit the hand from transporting out of the carrier those of the substrates that have the amount of horizontal substrate displacement toward the deep end of the carrier exceeding the threshold.

7. A substrate treating apparatus comprising:
    a receiver for receiving a carrier placed thereon, the carrier being constructed to contain a plurality of substrates;
    a substrate detecting sensor for detecting presence or absence of each substrate in at least two different locations in a fore-and-aft direction in which the substrates are moved into and out of the carrier;
    a height sensor for detecting heights of the substrate detecting sensor;
    an up-and-down mechanism for moving the substrate detecting sensor up and down;
    a controller for causing the substrate detecting sensor to detect presence or absence of each substrate and causing the height sensor to detect heights of the substrate detecting sensor for detecting heights of each substrate in at least two different locations in the fore-and-aft direction by operating the up-and-down mechanism to move the substrate detecting sensor up and down; and a substrate condition acquiring unit for acquiring a tilt of each substrate relative to a horizontal plane in the fore-and-aft direction based on a difference in heights of each substrate detected in the at least two different locations.

8. The substrate treating apparatus according to claim 7, further comprising:
a tilt defect determining unit for determining whether tilts of the substrates are larger than a threshold set beforehand;
a storage unit for accumulating tilt defect information on the tilts determined larger by the tilt defect determining unit, for each carrier or for each substrate holding position;
a number of times determining unit for determining whether the tilt defect information accumulated in the storage unit has reached a number of times set beforehand; and
a reporting unit for reporting that the tilt defect information has reached the number of times when the number of times determining unit determines so.

9. The substrate treating apparatus according to claim 7, wherein the substrate condition acquiring unit is configured to acquire an amount of horizontal substrate displacement toward a deep end of the carrier based on the tilt of each substrate relative to the horizontal plane in the fore-and-aft direction.

10. The substrate treating apparatus according to claim 9, wherein the carrier includes:
a main container body;
a lid attachable to and detachable from the main container body for blocking an opening of the main container body;
side holders provided on opposite side surfaces in the main container body for supporting the substrates;
rear holders provided on a rear surface in the main container body, and having grooves formed therein; and
front holders provided on a surface of the lid facing inside of the main container body, and having grooves formed therein;
wherein the rear holders and the front holders are configured to clamp the substrates therebetween while moving the substrates away from the side holders when the lid is attached to the opening of the main container body.

11. The substrate treating apparatus according to claim 10, further comprising:
a hand for raising the substrates placed on the side holders and transporting the substrates out of the carrier;
wherein a threshold is set for the amount of horizontal substrate displacement toward the deep end of the carrier to prevent backward edges of the substrates from contacting the grooves of the rear holders when the hand raises the substrates.

12. The substrate treating apparatus according to claim 11, wherein the controller is configured to prohibit the hand from transporting out of the carrier those of the substrates that have the amount of horizontal substrate displacement toward the deep end of the carrier exceeding the threshold.

13. A substrate treating method comprising:
placing on a receiver a carrier constructed to contain a plurality of substrates;
advancing into the carrier a substrate detecting sensor facing a horizontal direction crossing a fore-and-aft direction in which the substrates are moved into and out of the carrier, to be capable of detecting presence or absence of each substrate;
causing the substrate detecting sensor to detect presence or absence of each substrate and causing a height sensor to detect heights of the substrate detecting sensor for detecting heights of each substrate in at least two different locations in the fore-and-aft direction by moving the substrate detecting sensor up and down, and moving the substrate detecting sensor in the fore-and-aft direction in a state where the substrate detecting sensor has been advanced into the carrier; and
acquiring a tilt of each substrate relative to a horizontal plane in the fore-and-aft direction based on a difference in heights of each substrate detected in the at least two different locations.

14. A substrate treating method comprising:
placing on a receiver a carrier constructed to contain a plurality of substrates;
advancing into the carrier a substrate detecting sensor capable of detecting presence or absence of each substrate in at least two different locations in a fore-and-aft direction in which the substrates are moved into and out of the carrier;
causing the substrate detecting sensor to detect presence or absence of each substrate and causing a height sensor to detect heights of the substrate detecting sensor for detecting heights of each substrate in at least two different locations in the fore-and-aft direction by moving the substrate detecting sensor up and down in a state where the substrate detecting sensor has been advanced into the carrier; and
acquiring a tilt of each substrate relative to a horizontal plane in the fore-and-aft direction based on a difference in heights of each substrate detected in the at least two different locations.

* * * * *